(12) United States Patent
Van Voorst Vader et al.

(10) Patent No.: US 6,287,112 B1
(45) Date of Patent: Sep. 11, 2001

(54) WAFER BOAT

(75) Inventors: Pieter Johannes Quintus Van Voorst Vader, Son; Maarten Josef Teepen, Tilburg, both of (NL)

(73) Assignee: ASM International, N.V., Ac Bilthoven (NL)

( * ) Notice: Subject to any disclaimer, the term of this patent is extended or adjusted under 35 U.S.C. 154(b) by 0 days.

(21) Appl. No.: 09/538,661

(22) Filed: Mar. 30, 2000

(51) Int. Cl.[7] .................................................... F27D 5/00
(52) U.S. Cl. .................. 432/258; 432/253; 211/41.18; 118/728
(58) Field of Search .................................... 432/253, 258, 432/239, 241; 211/41.18; 118/715, 728

(56) References Cited

U.S. PATENT DOCUMENTS

| 5,192,371 | | 3/1993 | Shuto et al. . | |
|---|---|---|---|---|
| 5,310,339 | * | 5/1994 | Ushikawa | 432/253 |
| 5,316,472 | | 5/1994 | Niino et al. . | |
| 5,482,559 | * | 1/1996 | Imai et al. | 432/241 |
| 5,820,367 | * | 10/1998 | Osawa | 432/253 |
| 5,897,311 | * | 4/1999 | Nishi | 432/239 |
| 6,099,302 | * | 8/2000 | Hong et al. | 432/258 |

* cited by examiner

Primary Examiner—Gregory Wilson
(74) Attorney, Agent, or Firm—Knobbe, Martens, Olson & Bear, LLP

(57) ABSTRACT

Boat comprising a number of vertically extending rods for the accepting therein of shield rings. Each shield ring is provided with a number of projections or other carrying means for accepting a wafer. The 'thickness' of the shield rings in the radial direction is not constant according to the invention and is smaller close to one of the rods than in the area between two rods.

7 Claims, 3 Drawing Sheets

WAFER BOAT

BACKGROUND OF THE INVENTION

1. Technical Field

The invention relates to a wafer boat comprising an end member on both extremities connected by at least three axial rods, which rods define a housing surface for receiving of a number of axially spaced wafers. Moreover, for each wafer there are at least three supporting means connected to those columns and provided with accommodations.

2. Background Art

Such wafer boats are usually used vertically, that is, the wafers lie horizontally, one above the other. Any number of wafers can be accepted in such a boat. Such a boat is placed in a reactor where the wafer undergoes a treatment. Many types of treatment are possible, such as heat treatment, oxidation and other chemical and/or physical reactions.

With that, the problem of non-uniformity across the wafer surface occurs. That is, if the treatment gas is supplied radially, this will be depleted towards the center of the wafer. Consequently, the process or reaction in question will be further advanced at the edge of the wafer than in the center of the wafer. Such a non-uniformity is particularly undesirable.

In the American patent U.S. Pat. No. 5,192,371 in the name of ASM Japan K.K., the use of rings is described which are fitted at some distance under the wafer. The internal diameter of the ring corresponds to, or is a little smaller than, the external diameter of the wafer. Consequently, the uniformity of the reaction across the wafer surface is considerably increased, since the edge effect then occurs in the relevant ring.

A further embodiment of such a ring is encountered in the American patent U.S. Pat. No. 5,316,472.

In the first mentioned American patent U.S. Pat. No. 5,192,371, the ring also provides the supporting surface for the wafer.

SUMMARY OF THE INVENTION

Although a considerable improvement in the uniformity of various reactions can be achieved with the use of the above mentioned rings, certain reactions still have the problem that irregularities occur. An example of such a reaction is the so-called HTO process. There, silane and $N_2O$ are used. Radicals are generated in the gas phase, including sililene. These radicals attach themselves with particular preference onto the surfaces of solid materials such as the material of the axial rods of the boat.

The application of the ring described above gives insufficient uniformity.

The present invention aims to improve this uniformity.

The present invention also aims to provide a suitable support for a wafer.

The present invention also aims to provide centering of the wafer with regard to a shield ring.

According to an aspect of the invention, a wafer boat is provided which comprises an end member on both extremities connected by at least three axial rods, which rods define a housing surface for receiving therein a number of axially spaced wafers.

It has been found that the presence of the rods of the wafer boat has a disrupting effect on the uniformity. That is, an extra surface is created by these rods whereby, at the position of those rods, a depletion of the material taking part in any reaction occurs. This depletion not only occurs in the shield ring but also continues in the adjacent wafer. According to the invention, by locally decreasing the radial distance, less "material" meant for any reaction with the wafer will be removed locally due to the shield ring. This is completely compensated for by the presence of the rods and further fixing constructions of the wafer boat so that, along the circumference of the ring close to the wafer, uniform conditions prevail, whereby the desired uniformity of the process is realized.

Decreasing the distance can either be realized by the external presence of a recess close to the rods or by the internal fitting of such a recess, that is, close to the boundary with the wafer.

These two measures can clearly be combined. For this, any conceivable form can be applied.

According to a further aspect of the invention, the shield ring is provided with projection means on which the wafer rests. Moreover, according to a further variant of the invention, that projection is realized in steps and the wafer should be placed in the lower lying part. The higher lying part is close to the rods along which the wafer must be moved, and is realized with a comparatively small height while, close to the "rear" of the boat, this higher lying part can be higher to enable accurate and easy positioning.

Further aims and advantages of the invention are clear from the following description and several example embodiments.

SHORT DESCRIPTION OF THE DRAWINGS

The attached drawings show some example embodiments of the invention. Therein:

Figure 1:
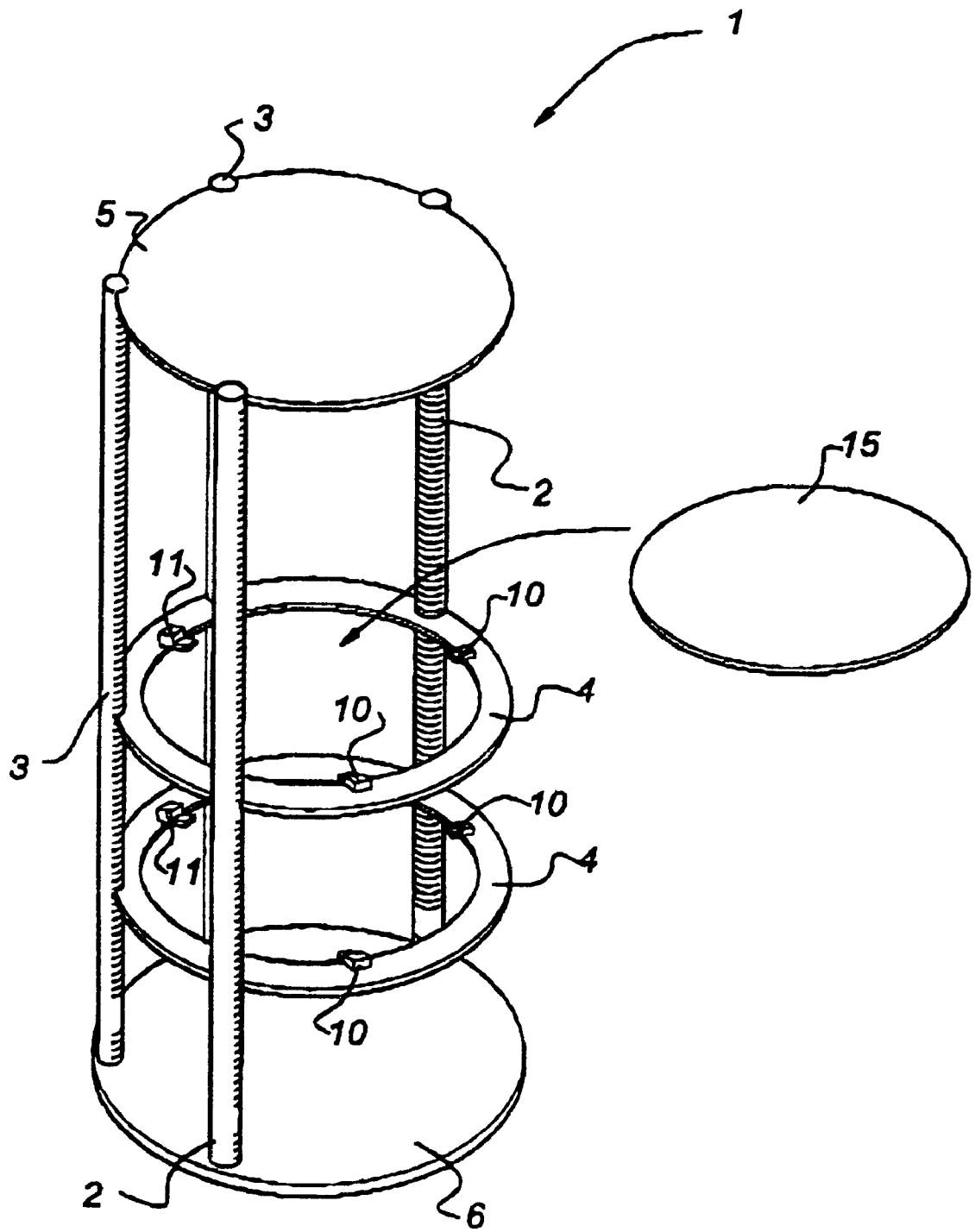
FIG. 1 shows a wafer boat, schematically and in perspective, with therein positioned shield rings according to the state of the art.

In FIG. 1, a wafer boat is generally indicated by 1. This consists of a number of rods 2 and 3. These are positioned so that the wafer 15 is moved between the rods 2 to lie adjacent and close to rods 3. Wafer boat 1 is provided with a number of shield rings 4 fixed to the rods 2 and 3. On the under side, there is an end shield 6, while on the top side, there is an end shield 5. One or more strengthening plates can be present in between.

Figure 2:
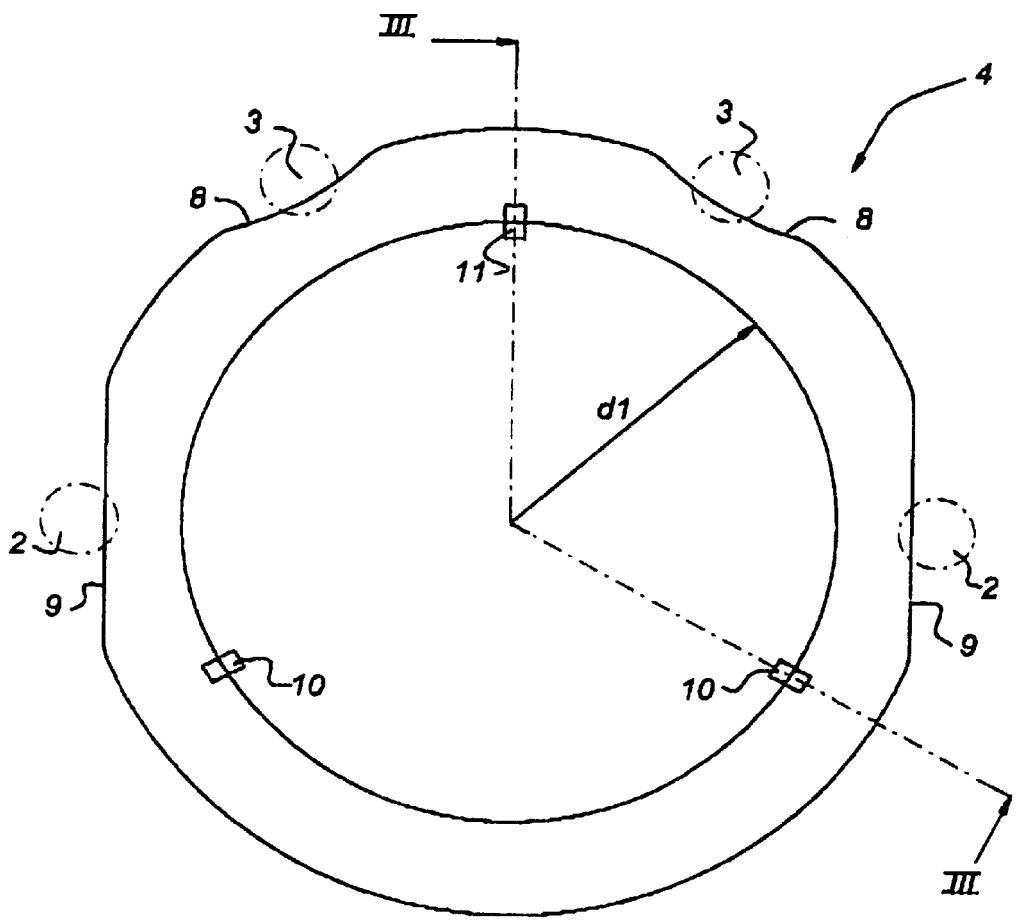
FIG. 2 shows top down view of a shield ring according to the invention, applied in the wafer boat according to FIG. 1.

The embodiment of the shield rings 4 is clearer in FIG. 2. In the embodiment shown there, this is provided with an internal circular part of diameter d1. This diameter is approximately equal to the external diameter of the wafer 15 to be accepted into the wafer boat. It will be understood that this diameter can be slightly larger or smaller, depending on the application.

Figure 3:
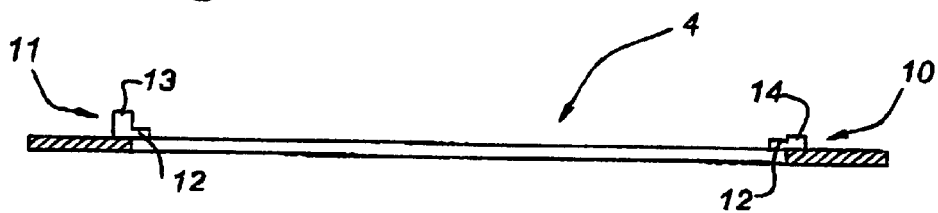
FIG. 3 shows the cross-section according to line III—III in FIG. 2.

In contrast to what is known in the state of the art, the external shape of the shield ring 4 is not circular. This is provided with recesses 8 close to the rods 3, and close to the rods 2, is provided with flattened edges 9. Supporting projections 10 and 11 respectively are present in 3 places. The exact form thereof is clear from FIG. 3 which is a cross-section according to the line III—III in FIG. 2.

From this, it is clear that supporting projection 11 consists of a basic part 12 and a raised part 13. The basic part 12 is also found at projection 10, but the raised part 14 does not extend as far. This is done to ease the introduction of wafers. The raised part 13 provides a good stop for the end position of the wafers. By positioning recesses 8 and flattened edges 9 respectively, less material is removed during any process due to the small surface of the shield ring 4 at that position. This is completely compensated for by the presence of the rods 2, 3.

Figure 4:
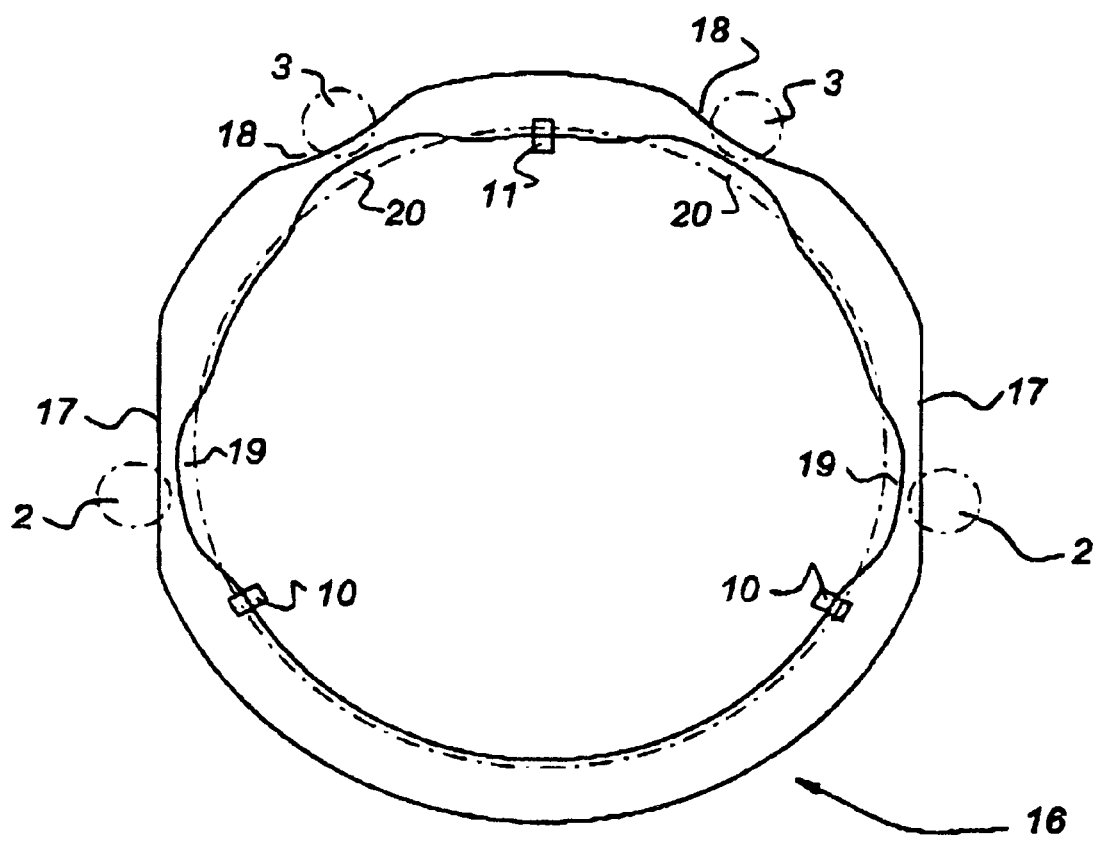
FIG. 4 shows a top-down view of a first variant of the shield ring according to the invention.

FIG. 4 shows a variant of the invention. The shield ring shown there is indicated as a whole by 16. Once again, there are flattened edges 17 near the rods 2. There are recesses 18 close to the rods 3.

In contrast to the construction described above, the shield ring does not have a circular internal form, but is provided with recesses 19, 20 to further reduce the radial width of the rings, to further reduce the surface and so to provide the "materials" taking part in the reaction with a uniform distribution.

It will be understood that combinations of the embodiment according to FIG. 4 with the earlier described construction are possible.

It is clear that further measures can be taken whereby the uniformity of the process that occurs on the wafer both in the radial direction and in the circumferential direction can be increased. Such changes are clear to those skilled in the state of the art after reading the above description and lie within the scope of the attached claims.

What is claimed is:

1. A wafer boat, comprising:

a first end member at a first extremity of the wafer boat;

a second end member at a second extremity of the wafer boat;

at least three axial rods connected between the first end member and the second end member to define a housing for receiving a number of axially spaced wafers;

shield rings configured to be fitted within the housing, wherein each shield ring defines a shield plane that extends substantially parallel to an accommodation plane for a wafer and has an inner circumference and an outer circumference, wherein the shield plane extends inside and outside said housing, and wherein a radial distance between the inner circumference and the outer circumference is smaller at ring section adjacent to the axial rod than at ring sections between the axial rods; and supports connected to the shield rings, wherein at least three supports are configured to accommodate a wafer and to define the accommodation plane for a wafer.

2. The wafer boat of claim 1, wherein each shield ring has recesses on the outer circumference at the ring sections adjacent to the axial rods.

3. The wafer boat of claim 1 wherein each shield ring has recesses on the inner circumference at the ring sections adjacent to the axial rods.

4. The wafer boat of claim 1, wherein the outer circumference of the shield ring is at least partly circular with flattened sides.

5. The wafer boat of claim 1, wherein the inner circumference of said shield ring is substantially circular.

6. The wafer boat of claim 1, wherein each support comprises projection means.

7. The wafer boat of claim 6, wherein each projection means comprises a base part and a centering part, wherein the centering part has a varying axial extension from the shield ring.

\* \* \* \* \*